United States Patent [19]

Val

[11] Patent Number: 4,559,579

[45] Date of Patent: Dec. 17, 1985

[54] DEVICE FOR THE PROTECTION OF AN ELECTRONIC COMPONENT AND/OR CIRCUIT AGAINST THE DISTURBANCES (VOLTAGES) GENERATED BY AN EXTERNAL ELECTROMAGNETIC FIELD

[75] Inventor: Christian Val, St. Remy les Chevreuses, France

[73] Assignee: Thomson CSF, Paris, France

[21] Appl. No.: 571,554

[22] PCT Filed: May 10, 1983

[86] PCT No.: PCT/FR83/00091
§ 371 Date: Jan. 3, 1984
§ 102(e) Date: Jan. 3, 1984

[87] PCT Pub. No.: WO83/04157
PCT Pub. Date: Nov. 24, 1983

[30] Foreign Application Priority Data

May 14, 1982 [FR] France .................................. 82 08489

[51] Int. Cl.⁴ .............................................. H02H 3/20
[52] U.S. Cl. ..................................... 361/220; 361/212; 361/56; 361/91; 338/21; 357/23.13
[58] Field of Search ................... 361/220, 212, 91, 56; 338/21; 357/23.13

[56] References Cited

U.S. PATENT DOCUMENTS

| 3,742,420 | 6/1973 | Harnden, Jr. ......................... 338/21 |
| 3,743,897 | 7/1973 | Harnden, Jr. ................. 357/23.13 X |
| 3,743,996 | 7/1973 | Harnden, Jr. ......................... 338/21 |
| 3,896,480 | 7/1975 | Harnden, Jr. ....................... 357/2 X |
| 3,916,366 | 10/1975 | Jefferson ............................... 338/21 |
| 4,045,712 | 8/1977 | De Tommasi .................... 338/21 X |

FOREIGN PATENT DOCUMENTS

| 31283 | 7/1981 | European Pat. Off. . |
| 45891 | 2/1982 | European Pat. Off. . |
| 2150324 | 4/1973 | France . |
| 0158478 | 12/1981 | Japan .............................. 357/23 GP |

Primary Examiner—Reinhard J. Eisenzopf
Attorney, Agent, or Firm—Cushman, Darby & Cushman

[57] ABSTRACT

A device for the protection of an electronic component and/or of a circuit, integrated in the carrier of the latter, against the disturbances (voltages) generated by an external electromagnetic field. It principally comprises an electrical connection (frame) whose conductivity increases considerably under the action of the external field, between each of the outlet connections of the component which is to be protected. This electrical connection is formed by a varistance and an electrode connected to the earth of the device.

10 Claims, 10 Drawing Figures

DEVICE FOR THE PROTECTION OF AN ELECTRONIC COMPONENT AND/OR CIRCUIT AGAINST THE DISTURBANCES (VOLTAGES) GENERATED BY AN EXTERNAL ELECTROMAGNETIC FIELD

The present invention relates to a device for the protection of an electronic component and/or circuit against the disturbances (voltages) generated by an external electromagnetic field, such as the so-called EMP (Electro Magnetic Pulse) attributable to a disintegration of atomic or nuclear nature.

BACKGROUND OF THE INVENTION

As known, the presence of an electromagnetic field causes the appearance of voltages in electronic components or circuits, which voltages may cause burn-out and destruction of the components. A protection is thus needed against these parasitic voltages and is the more difficult to establish, the more the field in question is liable to appear suddenly with a short rise time which may reach some ten nanoseconds in particular cases, which for example represents the case of the aforesaid EMP.

It is known that a protection of this kind may be effected by enclosing the circuit or component to be protected within a shield or Faraday cage. However, this protection proves inadequate because these components or circuits necessarily have electrical connections with the outside, which form antenna in the presence of an extraneous field and permit penetration of parasitic charges into the element which is to be protected.

SUMMARY OF THE INVENTION

An object of the present invention is to provide a protective device which makes it possible to avoid the aforesaid disadvantages, and this is effected by outwardly draining off the parasitic charges at the level of each of the connections of the element to be protected.

According to the invention, there is provided a device for the protection of an electronic device against an external electromagnetic field, said electronic device having output and input connections, said protection device comprising electrical connection means, said connection means comprising a first material and a second material said first material having an electrical conductivity which increases under the action of said external electromagnetic field, said second material being electrically conductive and being positioned on to said first material, said connection means being positioned between and in contact with, by means of said first material, each of said connections of said electronic device and a drain or a store for charges produced by said field.

BRIEF DESCRIPTION OF THE DRAWINGS

The invention will now be further described, by way of example, with reference to the accompanying drawings, in which.

In the various figures, identical references denote identical elements and the actual dimensions of these elements have not been adhered to for the sake of clarity of the drawings.

DESCRIPTION OF THE PREFERRED EMBODIMENTS

Figure 1:
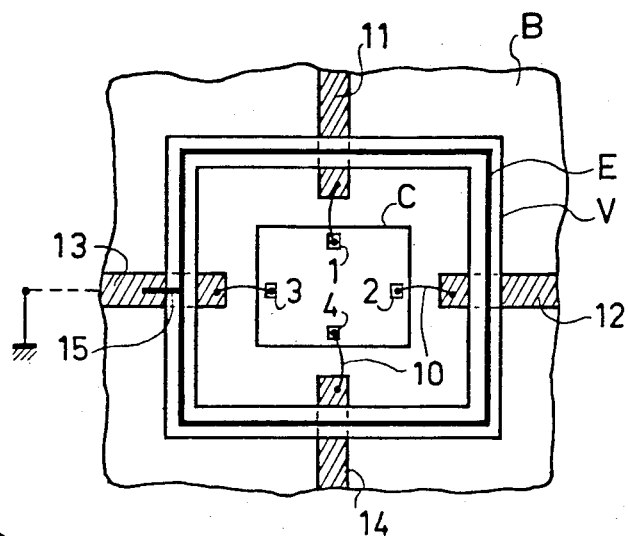
FIG. 1 illustrates a first embodiment of the device according to the invention, applied to the protection of an electronic component.

FIG. 1 thus illustrates an electronic component C provided with four connecting terminals 1,2,3 and 4, which are each connected in conventional manner by a conductive wire 10 to conductors, for example formed by the strips on the base of the housing B (ceramic or plastic) which carries the component, denoted by 11,12,13 and 14, respectively. In this example, the connection 3 and the strip 13 form the ground connection for the device.

According to the invention, a frame is provided enclosing the component close to the same, formed by a layer V of a varistance material covered by a conductive electrode E, for example having a width a little smaller than that of the layer V. This frame V is deposited on the base B and on the strips 11 to 14. The electrode E is connected to the strip 13 via a connector 15.

As is known, a varistance material which is commonly formed by doped zinc oxide (with oxides of bismuth, cobalt, chromium, molybdenum, antimony, etc.) has a non-linear resistance. It is not electrically conductive if the potential difference applied to it does not exceed a threshold voltage ($V_C$), and becomes conductive beyond this threshold. This phenomenon being caused by a field effect, the switching action between the conductive and non-conductive states is very fast (it may be equal to or shorter than 1 ns). A material of this nature may be deposited in any known manner: for example by screen printing on to the base B of the component C if the same is ceramic, or else may be deposited by cathodic vapourisation for example, if this carrier is of plastics material.

The operation of a device of this kind is the following. In the absence of any external electromagnetic field, the signals pass from the strips 11–14 to the terminals 1–4 of the component C without being effected by the frame V or the electrode E, because the varistance material is not conductive and the electrode E is thus insulated from the strips 11,12 and 14. When an electromagnetic field is applied to the device, and if its intensity is sufficient with respect to the threshold $V_C$ of the varistance material, this latter becomes conductive thus connecting the strips 11,12,13 and 14 to each other (and to ground) via the electrode E. The result is that the electrical charges produced by the external field do not penetrate into the component C but are drained to ground of the device, thereby establishing the protection function sought.

As is equally known, the threshold voltage $V_C$ of a varistance is a function of its thickness and may consequently be selected as a function of the intensities which may be expected of the electromagnetic interference fields, if these are known. In any event, the threshold $V_C$ should be higher than the highest operating voltage of the component C. In order to establish an effective protection, it is evident that this voltage $V_C$ should however be lower than the breakdown voltage of the component and preferably be as close as possible to its operating voltage. However, technological considerations in respect of the production tolerance on the thickness of the layer forming the varistance may lead to selecting $V_C$ to be of the order of two to three times the highest operating voltage of the component.

By way of example, for an operating voltage of 12 volts, the value selected for $V_C$ may be of the order of 30 volts, which is a lower voltage than the breakdown voltage of most existing electronic components.

It is apparent from the preceding that one advantage of the device according to the invention is that it is further able to be integrated in the housing of the component.

Figure 2:
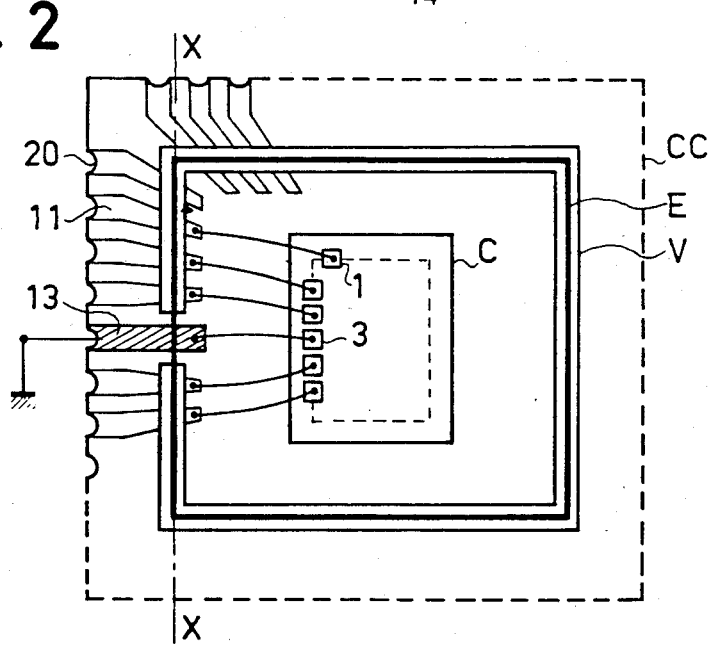
FIG. 2 illustrates a second embodiment of the device according to the invention, applied to a housing of the "chip carrier" type.

FIG. 2 shows, viewed from above, a practical embodiment of a device according to the invention in a housing of the "chip carrier" type. It will be recalled that a housing of this kind is essentially characterised by the absence of connecting pins which are replaced by metal deposits.

FIG. 2 shows diagrammatically the component C and some of its connecting contacts (1 and 3) secured on the substrate of a "chip carrier" housing marked CC. The substrate carries a number of conductors in the form of metal deposits such as 11 and 13, which are extended up to the periphery of the substrate at the level of semi-perforations (20). As is known, the conductive deposits are extended within these semi-perforations and through the cross-section of the base, terminating on the underside of the base at which they form the output connections of this latter.

Figure 3:
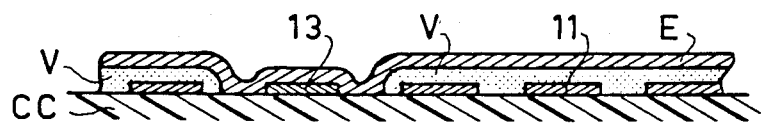
FIG. 3 is a view in partial cross-section of the device of FIG. 2.

As is apparent from FIG. 3, which is a view in partial cross-section taken along the axis XX of FIG. 2, the metallisations such as 11 and the grounding metallisation 13 are deposited direct on the substrate CC. The metallisations 11 are covered by the layer of varistance material V which surrounds the component C except at the level of the ground connection 13. The electrode E covers the layer V and is extended onto the grounding strip 13, thereby establishing the electrical connection between the elements E and 13.

The operation of the device according to the invention is the same as that described above with respect to FIG. 1.

Figure 4:
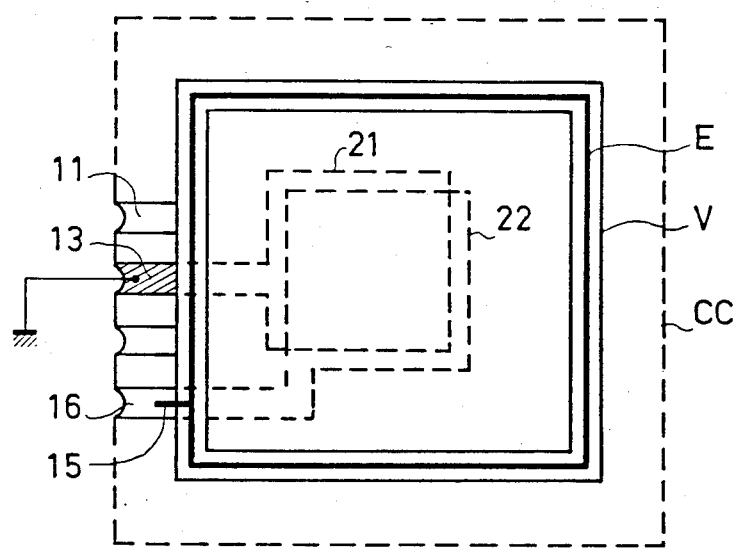
FIG. 4 illustrates a third embodiment of the device according to the invention, equally applied to a housing of the "chip carrier" type.

FIG. 4 illustrates another embodiment of the device according to the invention, equally applied to a housing of the chip carrier type, but also comprising a capacitance integrated into the base of the housing.

In this figure is again shown the substrate CC of a chip carrier viewed from above, having metallisations (11,13,16) distributed at its periphery, as well as the frame of varistance material V and the electrode E. Amongst the metallisations is again shown the metallisation 13 connected to ground, two metallisations such as 11, connected to the component which is not illustrated in this case, and a metallisation 16 which is not connected either to the component or to the outside of the device but which serves as a connection between the electrode E via the strip 15 and a metallisation 22 deposited on one of the surfaces of the substrate CC. The metallisation 22 forms one of the plates of a capacitor of which the dielectric is formed by the substrate CC and the other plate is formed by a metallisation 21 deposited on the other surface of the substrate. The metallisation 21 is connected to the ground connection 13.

As will be apparent from a comparison with the embodiment of FIG. 2, a capacitance (plates 21 and 22) has been inserted between the electrode E and the ground connection 13.

This embodiment allows at least a fraction of the charges produced by the external electromagnetic field to be stored on the spot by means of the capacitance thus interposed, in order to prevent an excessive charge transfer to ground which would be liable to cause trouble, for example a parasitic voltage by self-induction.

It should be noted that it is known to integrate capacitances with the substrate of a housing of the chip carrier type, which is described in particular in French patent application Nos. 79-11852, 80-18927 and 80-26076, all in the name of THOMSON-CSF. The preceding storage capacity may or may not coincide with the decoupling capacities described in the aforementioned patent applications.

Figure 5:
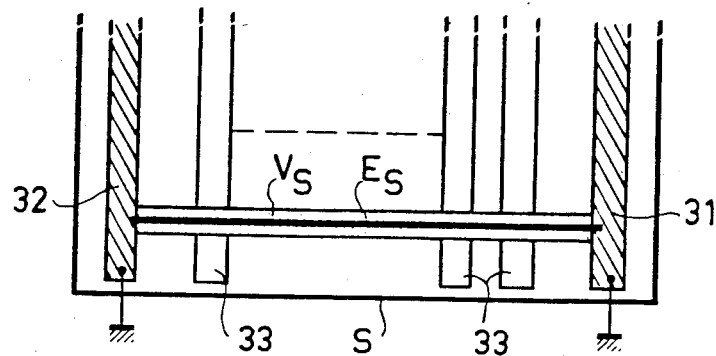
FIGS. 5, 6 and 7, illustrate three embodiments of the device according to the invention applied to the protection of an electronic circuit on a card.
Figure 6:
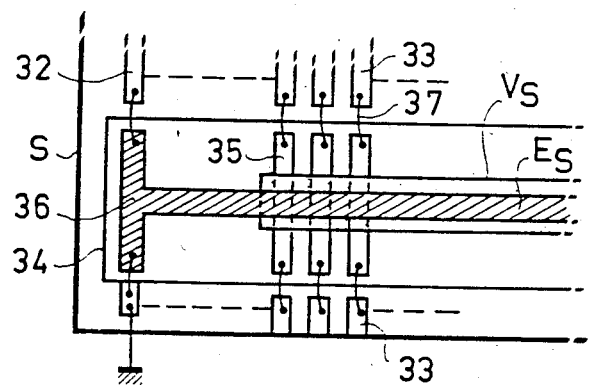
Figure 7:
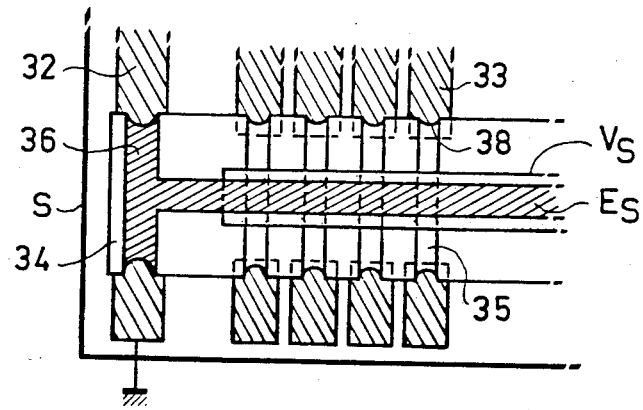

FIGS. 5, 6 and 7 illustrate three embodiments of the device according to the invention, applied to the protection of one or more electronic circuits on the same card (printed or ceramic circuit).

In FIG. 5 has been illustrated the extremity of a card S bearing one or more electronic components or circuits (not illustrated) viewed at its connecting extremity, that is to say that at which it ends in conductive strips intended to cooperate with other cards via connectors. These strips are of two kinds, for example, on the one hand being two earthing strips marked 31 and 32 respectively and situated at the two extremities of the card S, and on the other hand strips 33 providing the supply and the input and output for signals of the different circuits and components carried by the card S.

In accordance with the invention, this card S moreover carries a layer in the form of a strip of varistance material marked $V_S$, formed and deposited on the extremity of the strips 33 in advantageously the same manner as the frame V of the preceding figures, and covered by an electrode $E_S$ which is in electrical contact with the one or as it happens the strips (31 and 32) connected to the ground of the device.

Depending on whether the card S is of ceramic or a printed circuit, the varistance material $V_S$ may be deposited by silk screen printing or cathodic vapourisation, etc.

The operation of this protective device situated at the level of the card S is identical to that described previously for a single component. That means that when an external electromagnetic interference field is of sufficient intensity, the material forming the layer $V_S$ becomes conductive and the charges created externally of the card and entering via the connections 33 are drained to ground via the connections 31 and 32 via the electrode $E_S$ then in electrical contact with them. Consequently, they cannot reach the circuits carried by the card, thereby providing the protection sought.

It should be observed that this protective device shown in FIG. 5 may be utilised cumulatively with protective devices such as those shown in the preceding figures, at the level of each of the electronic components or circuits utilised on the card.

FIG. 6 illustrates a modified embodiment of the device for protection of an electronic card.

In this figure is again shown the card S, a ground connection 32 and input-output connections of different circuits marked 33. This card moreover carries small plate 34 which substantially covers the whole edge of the card S, interposed between the connections 32 and 33. This plate 34 is preferably of ceramic and carries the varistance layer $V_S$ and the electrode $E_S$, which are preferably deposited by silk screen printing on the plate 34, as well as electrodes 36 and 35 providing electrical continuity on the plate 34 between the strips 32 and 33 of the card S. The connections are established in FIG. 6 for example by means of soldered connection wires 37 or as illustrated in FIG. 7, by means of brazed semi-perforations 38 of the kind of the semi-perforations of the chip carriers.

This modified form, be it in its version of FIG. 6 or that of FIG. 7, makes it possible, due to interposition of the ceramic plate 34, to deposit the varistance material $V_S$ by means of a silk screen printing technique, if the card S is a printed circuit card incompatible with this technique.

In a modified embodiment which is not illustrated, it is possible to interpose a capacitance between the electrode $E_S$ and earth, for the same purpose as before.

Figure 8:
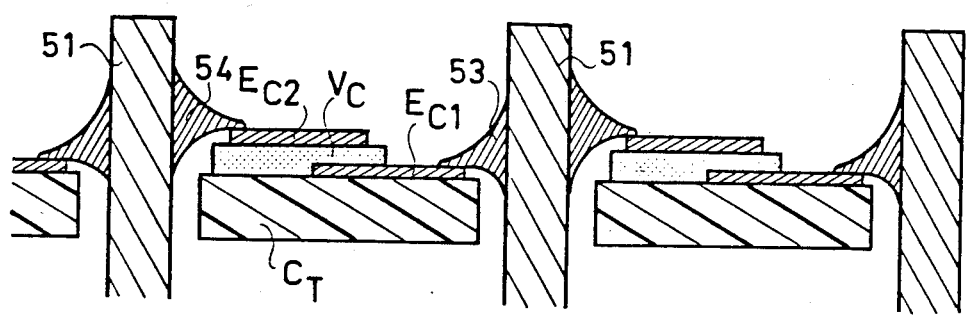
FIGS. 8, 9 and 10, illustrate three embodiments of the device according to the invention applied to a connector for cards bearing electronic circuits.
Figure 9:
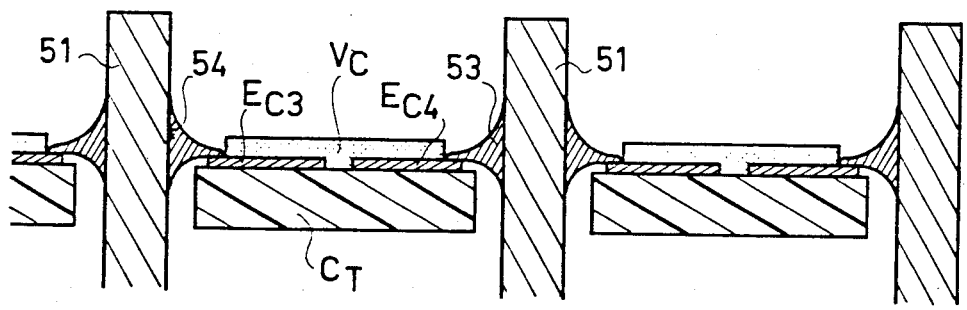
Figure 10:
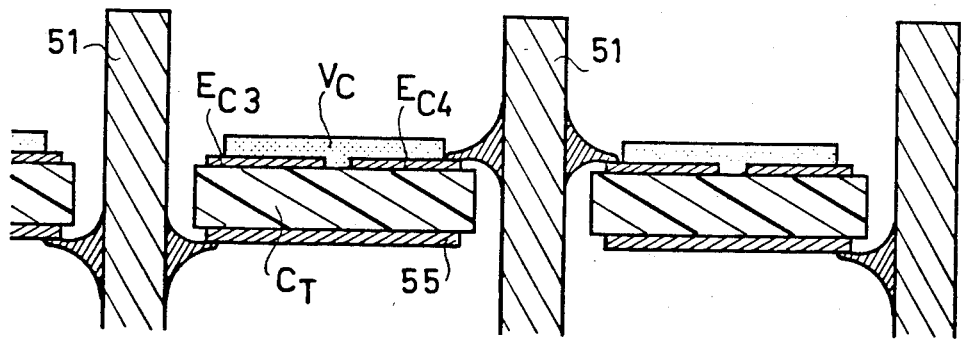

FIGS. 8, 9 and 10, illustrate three embodiments of the device according to the invention applied to a connector for a card bearing electronic circuits or components.

In FIG. 8 has been illustrated in cross-section a connector with its connecting pins 31 emerging via holes formed in an insulating base CT. On the same surface of the base CT and between each pair of pins 51 has been deposited a metallisation $E_{C1}$ in electrical contact with a brazed joint 53 connecting it to a pin 51 situated at the right in the drawing. This metallisation $E_{C1}$ is partially covered by a layer of varistance material $V_C$, itself covered by an electrode $E_{C2}$ which is out of contact with the electrode $E_{C1}$ but connected to another pin 51 situated at the left of the same element of the base CT in the drawing, by a brazed joint 54.

The operation of this device is similar to that of the preceding devices. The varistance material $V_C$ is so selected and dimensioned that it is insulating in the absence of an external electromagnetic interference field. In this manner, the different pins 51 are out of electrical contact with each other, in a conventional manner. In the presence of interference fields, the varistance material $V_C$ becomes conductive and it is apparent that two successive pins 51 are in electrical contact via, in sequence, the brazed joint 54, a first conductive layer $E_{C2}$, the varistance material $V_C$ rendered conductive, a second layer $E_{C1}$ and finally a second brazed joint 53. As previously, it is apparent that the charges produced by the interference field consequently lack any means of passing through the connector but are intended off, for example, towards one of the pins 51 connected to ground.

As before, too, this device for protection at the level of the connector, may be utilised comulatively with a protection at the level of the card and a protection at the level of the circuit or component itself.

FIG. 9 illustrates a modified embodiment of FIG. 8.

In this figure is again shown the connector illustrated by its connecting pins 51 and its insulating base CT. Two metallisations $E_{C3}$ and $E_{C4}$ out of electrical contact but situated at the same level, are deposited between two successive pins 51 on one and the same surface of the insulator CT. A layer of varistance material $V_C$ is deposited on the electrodes $E_{C3}$, $E_{C4}$ and between them. The electrical connection with the pins 51 is established via two brazed joints 54 and 55 respectively, connecting the electrodes $E_{C3}$ and $E_{C4}$ to their corresponding pins 51.

The operation is identical to that described in the foregoing. The only difference is of a technological nature. The electrodes $E_{C3}$ and $E_{C4}$ may be deposited in one and the same operation, the space between them being formed by laser engraving.

FIG. 10 illustrates another embodiment of the device according to the invention applied to a connector for an electronic circuit card which comprises an integrated capacitance, in a manner similar to that depicted in FIG. 4.

In this figure are again encountered the connecting pins 51 as well as the insulating base CT and, by way of example, the electrodes $E_{C3}$ and $E_{C4}$, and the varistance material $V_C$ as shown in FIG. 9. However, the other surface of the insulating layer CT moreover comprises an electrode marked 55, for example extending throughout the surface comprised between two pins 51. Furthermore, the brazed joints forming the electrical connection with the connecting pins 51 are slightly modified. Thus, one pin 51 is either connected at either side to the metallisations 55, or to the metallisations situated on the other surface $E_{C3}$ or $E_{C4}$.

During operation, it is apparent that the insulating material CT and the electrodes 55, $E_{C3}$ and $E_{C4}$ form a capacitance whose function is similar to that shown in FIG. 4.

I claim:

1. A device for the protection of an electronic device against an external electromagnetic field, said electronic device having output and input connections, said protection device comprising electrical connection means, said connection means comprising a first material and a second material said first material having an electrical conductivity which increases under the action of said external electromagnetic field, said second material being electrically conductive and being positioned on to said first material, said connection means being positioned between and in contact with, by means of said first material, each of said connections of said electronic device and a ground or a store for charges produced by said field.

2. A device according to claim 1, wherein said first material comprises a varistance material.

3. A device according to claim 1, said electronic device being an electronic component comprising connecting contacts, positioned on a base having strips connected to said contacts, said electrical connection means being in the form of a frame positioned around said component, said first material being a layer of varistance material deposited on said base and the strips it crosses, and said second material being an electrode deposited over said varistance layer, connected to the ground of said electronic device.

4. A device according to claim 3, wherein said electrode of the connection means which is connected to ground, is so connected via a capacitance.

5. A device according to claim 4, wherein said capacitance is formed by said base and two metallisations situated at either side of this latter.

6. A device according to claim 1, said electronic device being a card bearing at least one electronic component and conductive strips, said electrical connection means being in the form of a strip positioned towards one extremity of said card intended to cooperate with a connector, said first material being a layer of varistance material deposited on said card and over the strips it crosses, and said second material being an electrode deposited over said varistance layer, connected to the ground of said electronic device.

7. A device according to claim 1, said electronic device being a card bearing at least one electronic component and conductive strips, said protection device comprising a plate carrying conductive strips, positioned between said strips of said card towards one extremity of said card which is intended to cooperate with a connector, said first material being a layer in the form of a strip of varistance material, deposited on said plates and its strips which it crosses, said second material being an electrode deposited over said varistance layer, connected to the ground of said electronic device.

8. A device according to claim 1, said electronic device being a card positioned within a connector, said connector comprising an insulating base traversed by connecting pins, at least one of these pins being connected to ground, said electrical connection means comprising a first conductive layer deposited on a fraction of the surface of said base and in electrical contact with the connecting pins, a layer of varistance material deposited on said first conductive layer and on the parts left uncovered of said surface of the base, and a second conductive layer deposited on the varistance layer, in electrical contact with the connecting pins, the electrical contacts between the first and the second conductive layers and the pins being established in such a manner that the electrical contact between the pins is possible only via the varistance layer.

9. A device according to according to claim 6 or 7, wherein said conductive layer of the connection means which is connected to ground, is so connected via a capacitance.

10. A device according to claim 1, said electronic device being a card positioned within a connector, said connector comprising an insulating base traversed by connecting pins, at least one of these pins being connected to ground, said electrical connection means comprising a first conductive layer deposited on a fraction of the surface of said base and in electrical contact with said connecting pins, a second conductive layer deposited on the parts left uncovered of said surface of the base but out of contact with the first layer, and a layer of varistance material deposited over said first and second conductive layers, the electrical contacts between said first and second conductive layers and said pins being established in such a manner that side electrical contact between said pins is possible only through said varistance layer.

* * * * *